US008735273B2

(12) United States Patent
Lu et al.

(10) Patent No.: US 8,735,273 B2
(45) Date of Patent: May 27, 2014

(54) FORMING WAFER-LEVEL CHIP SCALE PACKAGE STRUCTURES WITH REDUCED NUMBER OF SEED LAYERS

(75) Inventors: Wen-Hsiung Lu, Jhonghe (TW);
Ming-Da Cheng, Jhubei (TW);
Chih-Wei Lin, Xinfeng Township (TW);
Yi-Wen Wu, Xizhi (TW); Hsiu-Jen Lin, Zhubei (TW); Chung-Shi Liu, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 409 days.

(21) Appl. No.: 13/179,299

(22) Filed: Jul. 8, 2011

(65) Prior Publication Data

US 2013/0009307 A1    Jan. 10, 2013

(51) Int. Cl.
*H01L 21/44* (2006.01)

(52) U.S. Cl.
USPC ........... 438/597; 438/614; 438/612; 438/613; 257/751; 257/762; 257/766; 257/779; 257/781

(58) Field of Classification Search
USPC .......... 438/597, 614, 612, 613; 257/751, 762, 257/766, 779, 781, E21.508
See application file for complete search history.

(56) References Cited

U.S. PATENT DOCUMENTS

| 5,072,520 | A  | * | 12/1991 | Nelson | 29/852 |
| 6,586,322 | B1 | * | 7/2003 | Chiu et al. | 438/612 |
| 6,940,169 | B2 | * | 9/2005 | Jin et al. | 257/738 |
| 7,749,882 | B2 | * | 7/2010 | Kweon et al. | 438/597 |
| 8,264,089 | B2 | * | 9/2012 | Alvarado et al. | 257/778 |
| 2004/0072387 | A1 | * | 4/2004 | Hong et al. | 438/108 |
| 2007/0045840 | A1 | * | 3/2007 | Varnau | 257/737 |
| 2007/0176290 | A1 | * | 8/2007 | Park et al. | 257/737 |
| 2007/0184577 | A1 | * | 8/2007 | Chung et al. | 438/106 |
| 2008/0001290 | A1 | * | 1/2008 | Chou et al. | 257/751 |
| 2010/0078772 | A1 |  | 4/2010 | Robinson | |
| 2011/0101520 | A1 | * | 5/2011 | Liu et al. | 257/737 |

OTHER PUBLICATIONS http://www.apicyamada.co.jp/english/product/main01.html#WCM-300L, Molding System Products, Apic Yamada Corporation, downloaded Jul. 8, 2011, 4 pgs.

* cited by examiner

*Primary Examiner* — Charles Garber
*Assistant Examiner* — Ron Pompey
(74) *Attorney, Agent, or Firm* — Slater and Matsil, L.L.P.

(57) ABSTRACT

A method includes forming a passivation layer over a metal pad, which is overlying a semiconductor substrate. A first opening is formed in the passivation layer, with a portion of the metal pad exposed through the first opening. A seed layer is formed over the passivation layer and to electrically coupled to the metal pad. The seed layer further includes a portion over the passivation layer. A first mask is formed over the seed layer, wherein the first mask has a second opening directly over at least a portion of the metal pad. A PPI is formed over the seed layer and in the second opening. A second mask is formed over the first mask, with a third opening formed in the second mask. A portion of a metal bump is formed in the third opening. After the step of forming the portion of the metal bump, the first and the second masks are removed.

20 Claims, 9 Drawing Sheets

FORMING WAFER-LEVEL CHIP SCALE PACKAGE STRUCTURES WITH REDUCED NUMBER OF SEED LAYERS

BACKGROUND

In the formation of wafer-level chip scale package structures, integrated circuit devices such as transistors are first formed at the surface of a semiconductor substrate in a wafer. Interconnect structures are then formed over the integrated circuit devices. A metal pad is formed over, and is electrically coupled to, the interconnect structures. A passivation layer and a first polyimide layer are formed on the metal pad, with the metal pad exposed through the openings in the passivation layer and the first polyimide.

A seed layer is then formed on the first polyimide, followed by the formation of post-passivation interconnect (PPI) lines and pads. The PPI lines and pads may be formed by forming and patterning a first photo resist on the seed layer, plating the PPI lines and pads in the openings in the first photo resist, and then removing the first photo resist. The portions of the seed layer that were previously covered by the first photo resist are removed. Next, a second polyimide layer is formed over the post-passivation interconnect lines and pads, and an under bump metallurgy (UBM) is formed extending into an opening in the second polyimide layer, wherein the UBM is electrically connected to the PPI interconnect lines and pads. The formation of the UBM also involves forming a UBM seed layer, forming and patterning a second photo resist, forming the UBM on the UBM seed layer, removing the second photo resist, and removing the portions of the UBM seed layer that were previously covered by the second photo resist.

In the above-discussed process steps, two photo resists are formed and removed, and two seed layers are formed and partially removed. The manufacturing cost is thus high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A post-passivation interconnect (PPI) structure and the methods of forming the same are provided in accordance with an embodiment. The intermediate stages of manufacturing various embodiments are illustrated. The variations and the operation of the embodiment are then discussed. Throughout the various views and illustrative embodiments, like reference numbers are used to designate like elements.

Figure 1:
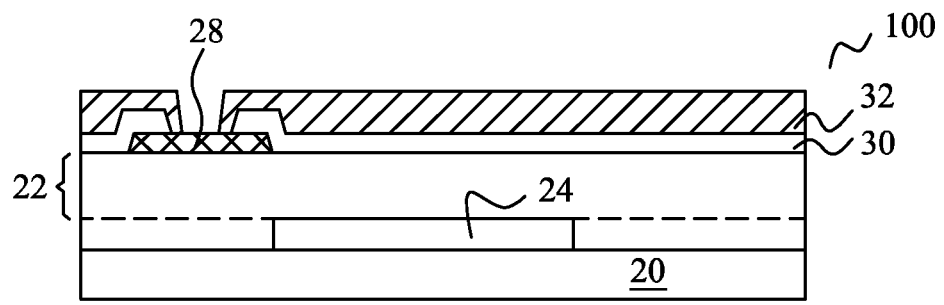
FIGS. 1 through 11 are cross-sectional views of intermediate stages in the manufacturing of a post-passivation interconnect (PPI) structure in accordance with various embodiments.

Referring to FIG. 1, wafer 100 is provided. Wafer 100 includes substrate 20, which may be a semiconductor substrate, such as a silicon substrate, although it may be formed of other semiconductor materials, such as silicon germanium, silicon carbon, gallium arsenide, or the like. Semiconductor devices 24, such as transistors, may be formed at the surface of substrate 20. Interconnect structure 22, which includes metal lines and vias (not shown) formed therein, is formed over substrate 20, and is electrically coupled to semiconductor devices 24. The metal lines and vias may be formed of copper or copper alloys, and may be formed using damascene processes. Interconnect structure 22 may include an inter-layer dielectric (ILD, not shown) and inter-metal dielectrics (IMDs, not shown). In alternative embodiments, wafer 100 is an interposer wafer or a package substrate, and is substantially free from integrated circuit devices including transistors, resistors, capacitors, inductors, and/or the like, formed therein.

Metal pad 28 is formed over interconnect structure 22. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 24, for example, through the underlying interconnect structure 22. Passivation layer 30 may be formed to cover edge portions of metal pad 28. In an exemplary embodiment, passivation layer 30 is formed of a silicon oxide layer and a silicon nitride layer over the silicon oxide layer, although other dielectric materials may be used. An opening is formed in passivation layer.

Figure 2:
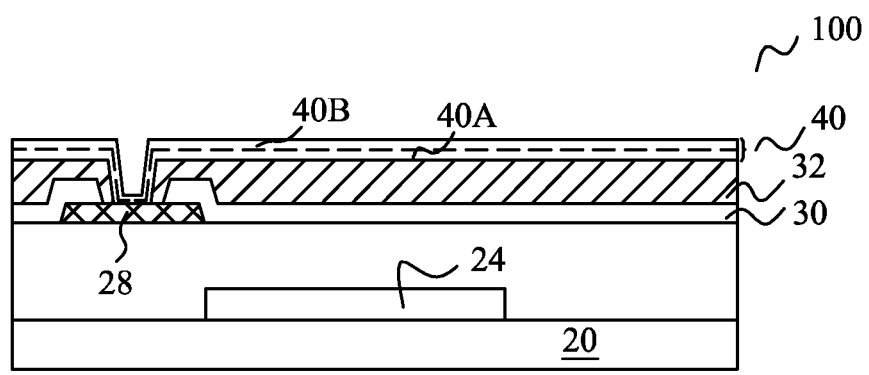

Polyimide layer 32 is formed over passivation layer 30, wherein polyimide layer 32 extends into the opening in passivation layer 30. Another opening is formed in polyimide layer 32 to expose metal pad 28. Next, as shown in FIG. 2, seed layer 40 is formed over polyimide layer 32. Seed layer 40 may include layers 40A and 40B. Layer 40A may be a titanium layer, a titanium nitride layer, a tantalum layer, a tantalum nitride layer, or the like. The materials of layer 40B may include copper or copper alloys. In an embodiment, seed layer 40 is formed using physical vapor deposition, while other applicable methods may also be used.

Figure 3:
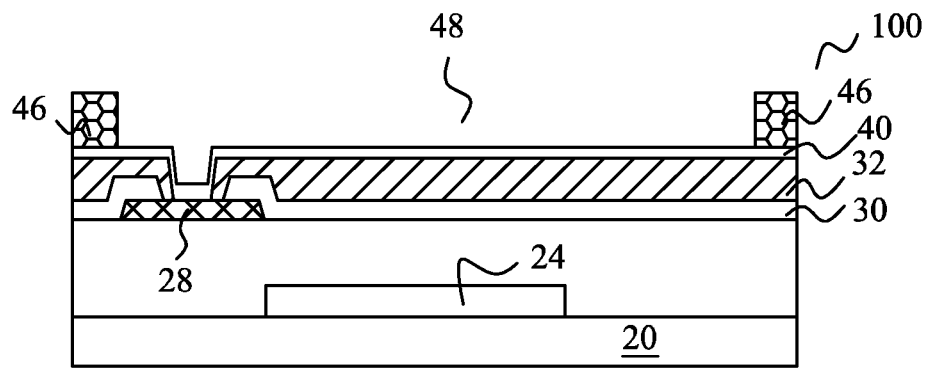
Figure 4:
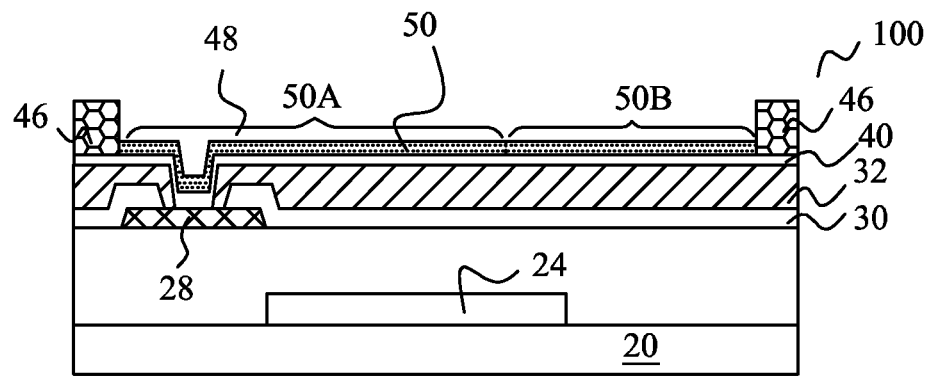
Figure 18:
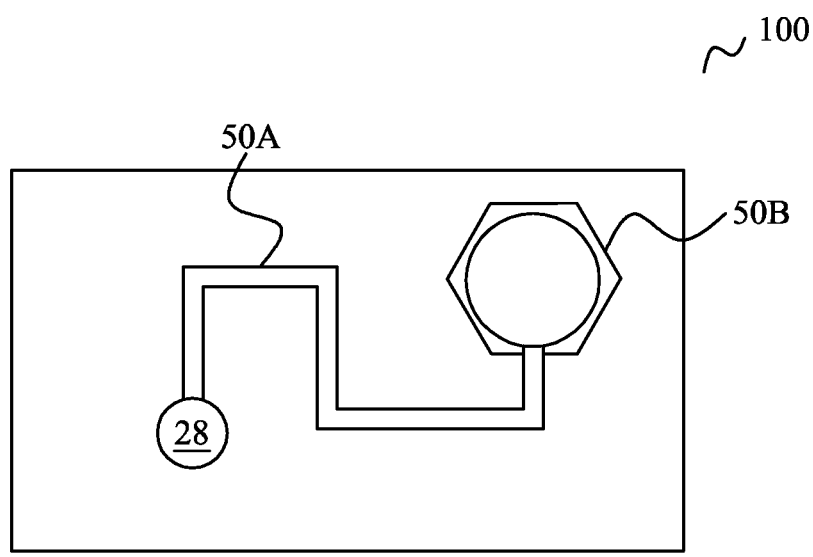
FIG. 18 is a top view of a portion of the PPI structure.

FIG. 3 illustrates the formation of mask 46. In an embodiment, mask 46 is formed of a photo resist, and hence is alternatively referred to as photo resist 46 throughout the description, although other materials may be used. A portion of seed layer 40 is exposed through opening 48 in mask 46. Next, a plating step is performed to form PPI 50 in opening 48, as shown in FIG. 4. PPI 50 may be formed of copper or copper alloys, and may include PPI line 50A and PPI pad 50B. A top view of exemplary PPI 50 is shown in FIG. 18.

Figure 5:
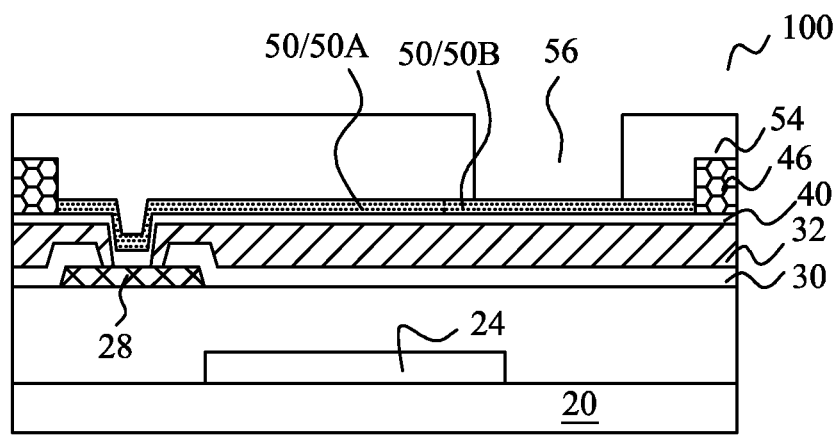

In FIG. 5, without removing photo resist 46, mask 54 is formed over photo resist 46, and is then patterned. In an embodiment, mask 54 is formed of a photo resist, and hence is referred to as photo resist 54 through the description. Photo resists 46 and 54 may be in physical contact. Photo resists 46 and 54 may be formed of the same or different materials. Photo resist 54 covers photo resist 46 and portions of PPI 50. At least a portion of PPI pad 50B is exposed through opening 56 in photo resist 54.

Figure 6:
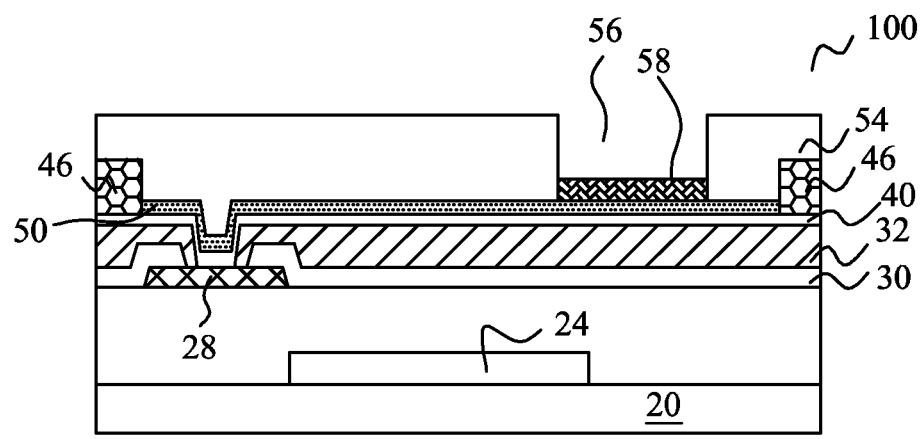
Figure 7:
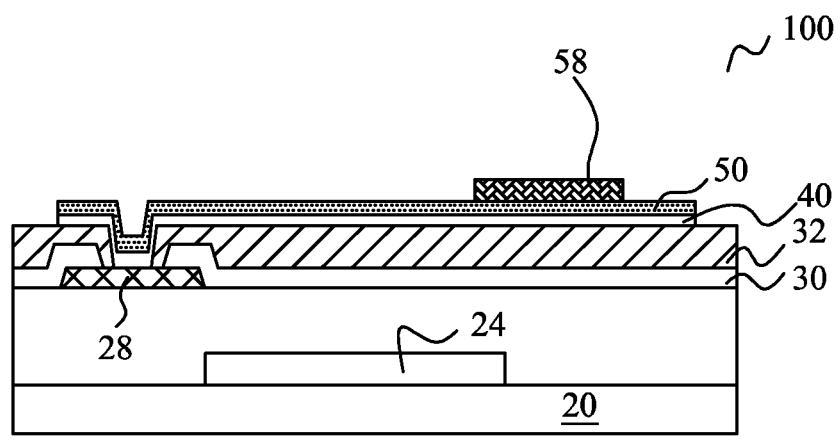
Figure 8:
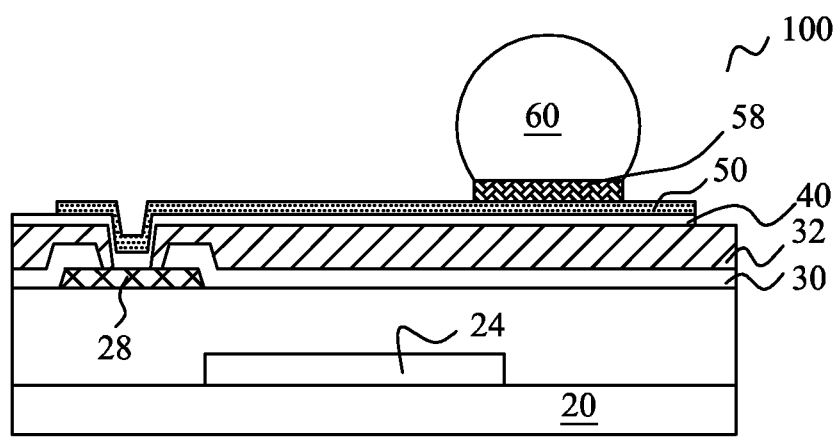

Next, as shown in FIG. 6, metal layer 58 is plated onto PPI 50 and inside opening 56. Metal layer 58 is a portion of a metal bump including metal layer 58 and solder ball 60 (FIG. 8). Metal layer 58 may comprise a material different from the material of PPI 50. In an embodiment, metal layer 58 is a nickel-containing layer, although it may also comprise other metals such as palladium. In an embodiment, there is no additional seed layer formed between metal layer 58 and PPI 50. For example, there is no additional titanium layer and/or copper layer between metal layer 58 and PPI 50. In FIG. 7, photo resists 46 and 54 are removed. Photo resists 46 and 54 may be removed in a single photo resist stripping process, although they can also be removed separately if they are formed of different photo resist materials. Next, the exposed portions of seed layer 40 that were previously covered by photo resist 46 are removed by etching, while the portions of seed layer 40 covered by PPI 50 remain un-removed.

Figure 9:
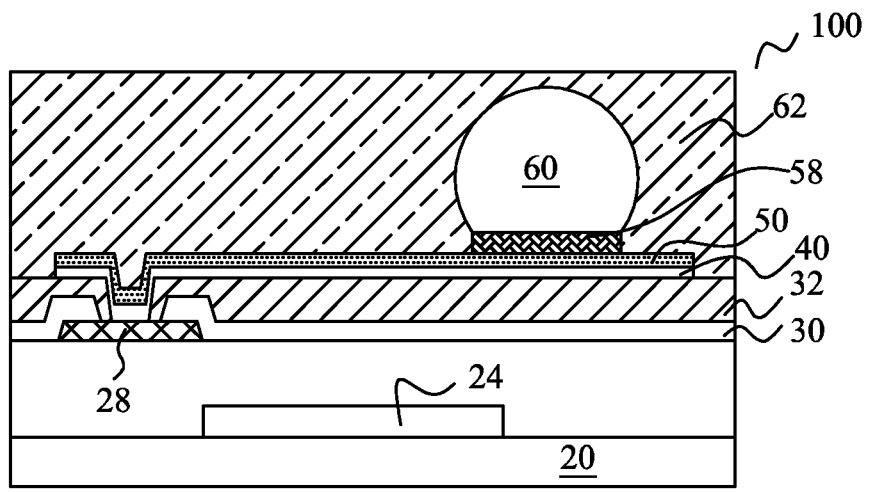
Figure 10:
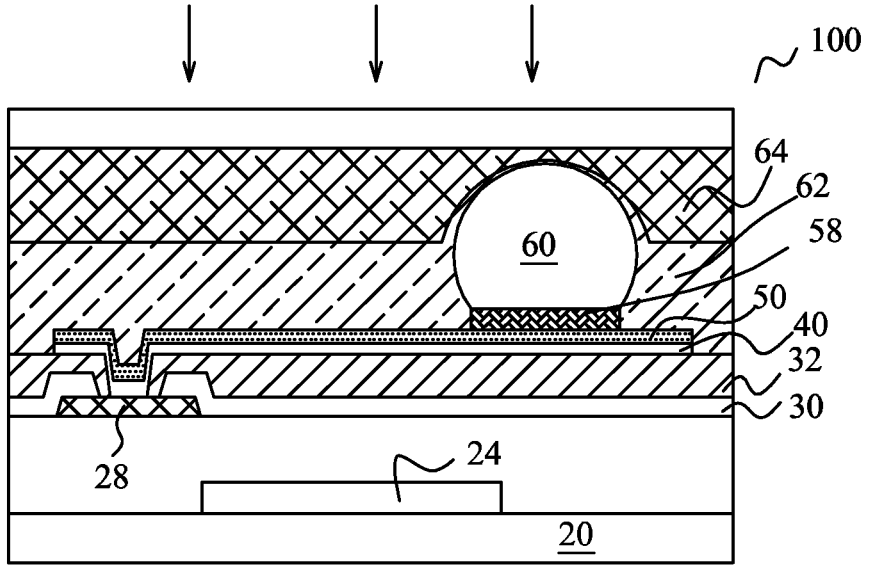

FIG. 8 illustrates the placing/mounting of an additional portion of metal bump 60, which may be a solder ball (and hence is referred to solder bump 60 hereinafter) formed of Sn—Ag, Sn—Ag—Cu, or the like, and may be lead-free or lead-containing. Solder bump 60 is then reflowed. Next, as shown in FIG. 9, liquid molding compound 62 is applied on wafer 100, where solder bump 60 may be submerged under liquid molding compound 62. Referring to FIG. 10, release film 64 is applied on liquid molding compound 62. A pressure is applied, as shown by arrows. Release film 64 is formed of a soft material, so that a portion of solder ball 60 is pressed into release film 64. Furthermore, release film 64 pushes some of liquid molding compound 62 away from the top surface of wafer 100, and the bottom surface of release film 64 is lower than the top end of solder bump 60. With release film 64 remaining being pushed against solder bump 60 and liquid molding compound 62, a curing is performed to cure and solidify liquid molding compound 62. After the solidification of molding compound 62, the top end of solder bump 60 is lower than the top surface of molding compound 62.

Figure 11:
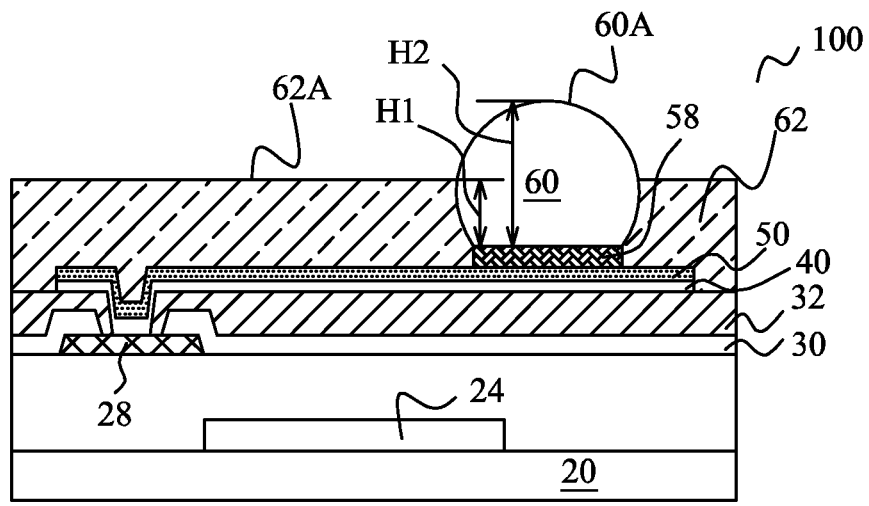

Referring to FIG. 11, release film 64 is peeled off from molding compound 62, which is now in a solid form. The molding compound residue remaining on the top surface of solder bump 60 is etched. In the resulting structure, molding compound 62 is formed with a portion of solder bump 60 buried therein. The top end 60A of solder bump 60 may be higher than top surface 62A of molding compound 62. Furthermore, since solder bump 60 is not polished after the reflow, the top portion of solder bump 60 above molding compound 62 may remain to have a rounded profile. Molding compound 62 may be in physical contact with polyimide layer 32, PPI 50, and/or solder bump 60. On the other hand, there is no polyimide layer over PPI 50 and/or contacting solder bump 60. In an embodiment, height H1 of solder bump 60 that is buried in molding compound 62 may be between about ¼ to ¾ of the total height H2 of solder bump 60.

Figure 12:
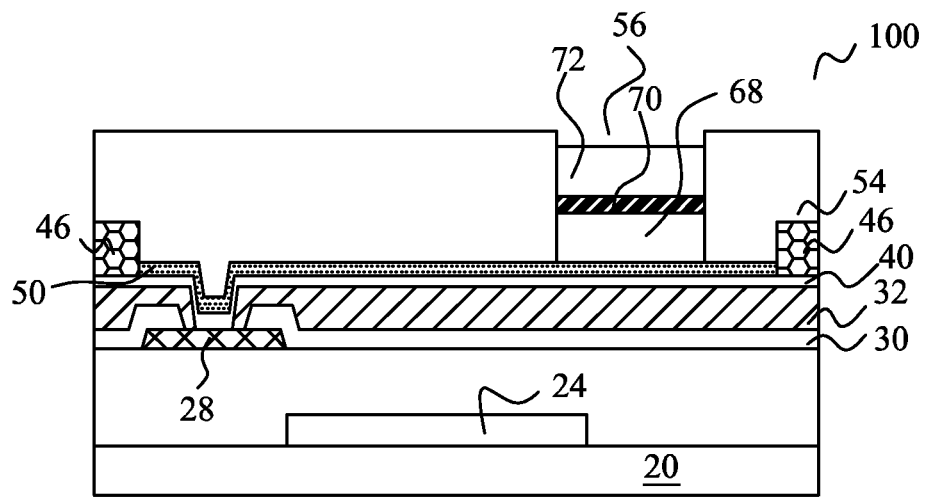
FIGS. 12 through 17 are cross-sectional views of intermediate stages in the manufacturing of a post-passivation interconnect (PPI) structure in accordance with alternative embodiments, wherein a metal finish is formed on a PPI.
Figure 13:
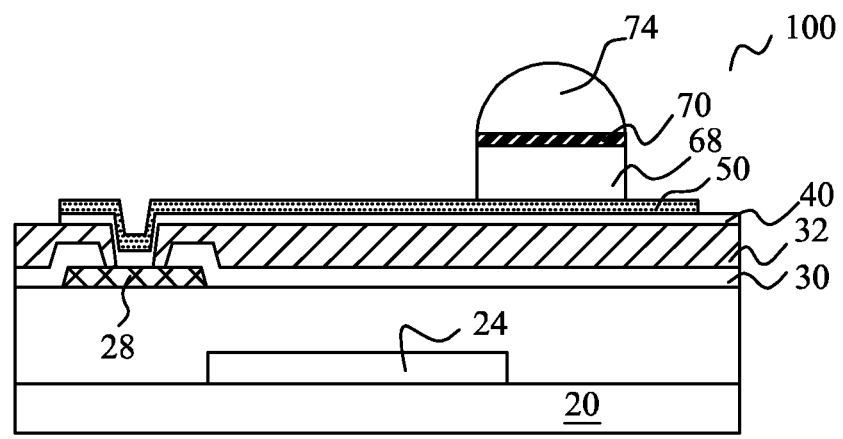
Figure 14:
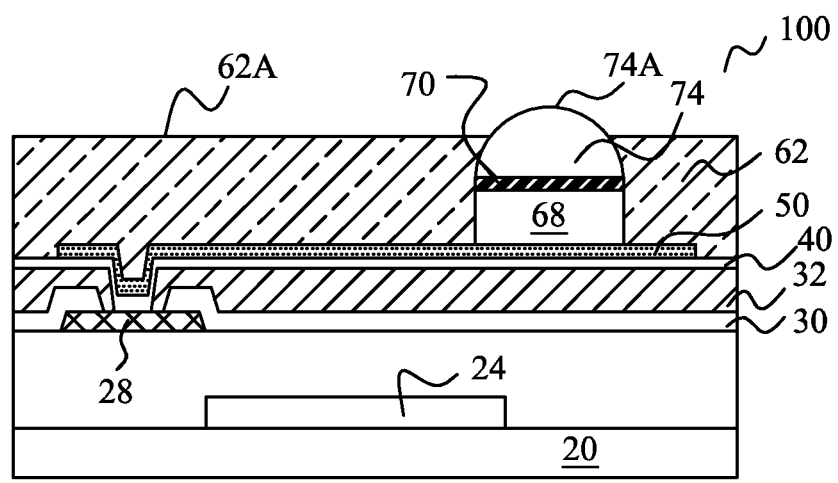

FIGS. 12 through 14 illustrate the cross-sectional views in the manufacturing of a PPI structure in accordance with an alternative embodiment. Unless specified otherwise, the reference numerals in these embodiments represent like elements in the embodiments illustrated in FIGS. 1 through 11. The initial steps of this embodiment are essentially the same as shown in FIGS. 1 through 5. Next, as shown in FIG. 12, copper post 68 is plated into opening 56. The thickness of copper post 68 may be between about 10 μm and about 50 μm, for example. Copper post 68 is thus in contact with the top surface of PPI 50. In some embodiments, there is no seed layer between copper post 68 and PPI 50. For example, there is no titanium-containing layer between copper post 68 and PPI 50. Copper post 68 may have substantially vertical sidewalls. After the formation of copper post 68, nickel layer 70 and solder layer 72 may also be plated into opening 56 optionally. Throughout the description, copper post 68, nickel layer 70, and solder layer 72 are also individually or in combination referred to as metal bumps.

Next, as shown in FIG. 13, photo resists 46 and 54 are removed, for example, in a single photo resist stripping process. The resulting exposed portions of seed layer 40 is then removed, while the portions of seed layer 40 covered by PPI 50 remain un-removed. A reflow may then be performed to reflow solder layer 72 into solder ball 74.

In subsequent process steps, the steps as shown in FIGS. 9-11 are performed to form molding compound 62. The resulting structure is shown in FIG. 14. Top surface 62A of molding compound 62 may be lower than top end 74A of solder ball 74. In addition, top surface 62A of molding compound 62 may be lower than the top surface of nickel layer 70, or lower than the top surface of copper post 68.

Figure 15:
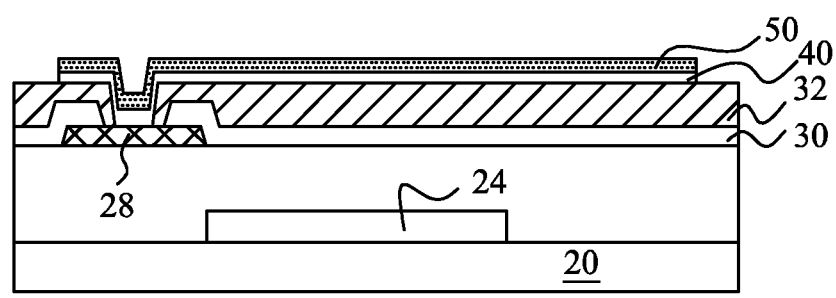
Figure 16:
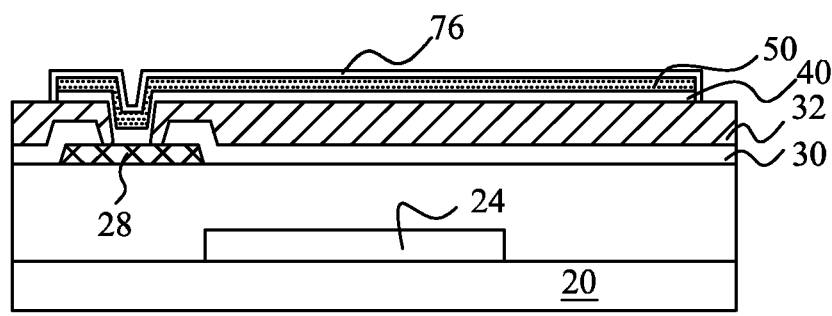
Figure 17:
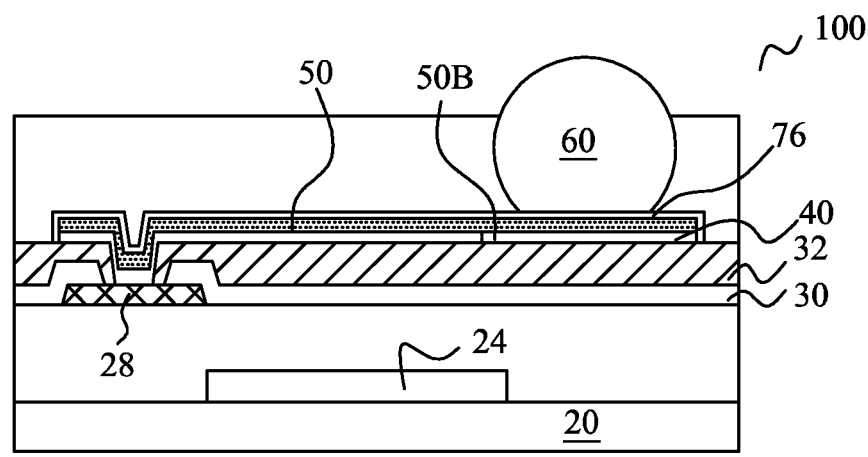

FIGS. 15 through 17 illustrate the cross-sectional views in the manufacturing of a PPI structure in accordance with yet other embodiments. The initial steps of this embodiment are essentially the same as shown in FIGS. 1 through 4. Next, as shown in FIG. 15, photo resist 46 (as in FIG. 4) is removed, and the exposed portions of seed layer 40 not covered by PPI 50 are removed. Referring to FIG. 16, metal finish 76 is formed. In an embodiment, metal finish 76 is formed of electroless nickel electroless palladium immersion gold (ENEPIG), which includes a nickel layer, a palladium layer on the nickel layer, and a gold layer on the palladium layer. The gold layer may be formed using immersion plating. In other embodiments, metal finish 76 may be formed of other known finish materials and using known methods, including, but not limited to, electroless nickel immersion gold (ENIG), direct immersion gold (DIG), or the like.

FIG. 17 illustrates the placing of solder bump 60 and the formation of molding compound 62. Solder bump 60 may be placed directly over, and in physical contact with, the portion of metal finish 76 directly over PPI pad 50B. Accordingly, metal finish 76 acts as an under bump metallurgy (UBM). A reflow is performed to reflow solder bump 60. FIG. 18 illustrates an exemplary top view of metal pad 28, PPI line 50A, and PPI pad 50B. PPI pad 50B may be vertically misaligned with metal pad 28.

In the embodiments, by using the molding compound to protect solder bump 60, a polyimide layer that otherwise would have been formed over PPI 50 may be eliminated. The cost for forming the UBM, including the cost for forming and stripping photo resist and forming a seed layer is thus saved. Furthermore, in the embodiments, by stripping photo resists 46 and 54 (FIGS. 6 and 7) in a single photo resist stripping process, the manufacturing cost is further reduced.

In accordance with embodiments, a method includes forming a passivation layer over a metal pad, wherein the metal pad is further overlying a semiconductor substrate. A first opening is formed in the passivation layer, with a portion of the metal pad exposed through the first opening. A seed layer is formed over the passivation layer. The seed layer is electrically coupled to the metal pad, wherein the seed layer further includes a portion over the passivation layer. A first mask is formed over the seed layer, wherein the first mask has a second opening directly over at least a portion of the metal pad. A PPI is formed over the seed layer and in the second opening. A second mask is formed over the first mask, with a third opening formed in the second mask. A portion of a metal bump is formed in the third opening. After the step of forming the portion of the metal bump, the first and the second masks are removed.

In accordance with other embodiments, a method includes forming a passivation layer over a metal pad, wherein the metal pad is further overlying a semiconductor substrate. A polyimide layer is formed over the passivation layer. A seed layer is formed to electrically couple to the metal pad. A first mask is formed over the passivation layer, wherein the first mask includes an opening, with the opening being directly over at least a portion of the metal pad. A PPI is formed over the seed layer and in the second opening. A metal bump is formed directly over and electrically coupled to the PPI. The first mask is then removed. A molding compound is formed over the PPI, wherein the molding compound is in physical contact with the metal bump and the PPI.

In accordance with yet other embodiments, a circuit structure includes a metal pad over a semiconductor substrate, a passivation layer having a portion over the metal pad, and a polyimide layer over the passivation layer. The circuit structure further includes a PPI having a first portion over the polyimide layer, and a second portion extending into the polyimide layer. The PPI is electrically coupled to the metal pad. A metal bump is over and contacting a portion of the PPI. A molding compound is over the PPI. The molding compound surrounds, and is in physical contact with, a lower portion of the metal bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a passivation layer over a metal pad, wherein the metal pad is further overlying a semiconductor substrate;
    forming a first opening in the passivation layer, wherein a portion of the metal pad is exposed through the first opening;
    forming a seed layer over the passivation layer, wherein the seed layer is electrically coupled to the metal pad;
    forming a first mask over the seed layer, wherein the first mask comprises a second opening, with the second opening being directly over at least a portion of the metal pad;
    forming a post-passivation interconnect (PPI) over the seed layer and in the second opening;
    forming a second mask over the first mask;
    forming a third opening in the second mask, wherein the third opening is misaligned from the first opening;
    forming at least a portion of a metal bump in the third opening; and
    after the step of forming the portion of the metal bump, removing the first and the second masks.

2. The method of claim 1, wherein the first and the second masks are photo resists.

3. The method of claim 1, wherein the first and the second masks are in physical contact with each other.

4. The method of claim 1 further comprising, after the step of removing the first and the second masks, removing exposed portions of the seed layer not covered by the PPI.

5. The method of claim 1, wherein the step of forming the at least the portion of the metal bump comprises forming a nickel layer in the opening, and wherein the method further comprises, after the step of removing the first and the second masks, placing a solder ball over the nick layer and reflowing the solder ball.

6. The method of claim 1, wherein the step of forming the metal bump comprises:
    forming a copper post over and in physical contact with the PPI;
    forming a solder layer over the copper post; and
    reflowing the solder layer.

7. The method of claim 1 further comprising:
    applying a liquid molding compound over the metal bump and the PPI;
    applying a release film over the liquid molding compound;
    pressing the release film against the liquid molding compound, until a top surface of the liquid molding compound is lower than a top end of the metal bump; and
    curing the liquid molding compound.

8. A method comprising:
    forming a passivation layer over a metal pad, wherein the metal pad is further overlying a semiconductor substrate;
    forming a polyimide layer over the passivation layer;
    forming a seed layer electrically couple to the metal pad, wherein the seed layer comprises a portion over the polyimide layer;
    forming a first mask over the polyimide layer, wherein the first mask comprises a first opening, with the first opening being directly over at least a portion of the metal pad;
    forming a post-passivation interconnect (PPI) over the seed layer and in the first opening;
    plating a metal finish on a top surface and sidewalls of the PPI and the seed layer;
    forming a metal bump over and electrically coupled to the PPI;
    removing the first mask; and
    forming a molding compound over the PPI, wherein the molding compound is in physical contact with the metal bump and the PPI.

9. The method of claim 8 further comprising:
    after the step of forming the seed layer and without removing the first mask, forming a second mask over the first mask;
    forming a second opening in the second mask;
    performing the step of forming the metal bump, wherein the metal bump is formed in the second opening; and
    after the step of forming the metal bump, removing the second mask in a same removal step as removing the first mask.

10. The method of claim 9, wherein the step of forming the metal bump comprises plating a nickel layer over and in physical contact with the PPI, wherein the method further comprises, after the step of removing the first and the second masks, placing and reflowing a solder ball on the nick layer.

11. The method of claim 8, wherein the step of forming the metal bump comprises:
    plating a copper post over and in physical contact with the PPI;
    plating a solder layer over the copper post; and
    reflowing the solder layer into a solder ball.

12. The method of claim 8 further comprising:
after the steps of forming the PPI and removing the first mask, removing exposed portions of the seed layer not covered by the PPI;
mounting a solder ball as a part of the metal bump over and contacting the metal finish; and
performing a reflow on the solder ball.

13. The method of claim 8, wherein the first mask is a photo resist.

14. The method of claim 8, wherein the step of forming the molding compound comprises:
applying a liquid molding compound over the metal bump and the PPI;
applying a release film and pressing the liquid molding compound using the release film, until a top surface of the liquid molding compound is lower than a top end of the metal bump; and
curing the liquid molding compound to form the molding compound.

15. A device comprising:
a semiconductor substrate;
a metal pad over the semiconductor substrate;
a passivation layer comprising a portion over the metal pad;
a polyimide layer over the passivation layer;
a post-passivation interconnect (PPI) comprising a first portion over the polyimide layer, and a second portion extending into the polyimide layer, wherein the PPI is electrically coupled to the metal pad, wherein the PPI comprises a PPI line and a PPI pad, and wherein the PPI pad is vertically misaligned to the metal pad;
a metal finish on a top surface and sidewalls of the PPI, wherein the metal finish comprises a pad portion over and contacting the PPI pad;
a metal bump over and contacting the pad portion of the metal finish; and
a molding compound over the PPI, wherein the molding compound surrounds, and is in physical contact with, a lower portion of the metal bump.

16. The device of claim 15, wherein the PPI comprises copper, and wherein the molding compound is further in physical contact with the PPI.

17. The device of claim 16 further comprising a nickel layer over and in physical contact with the PPI, wherein the metal bump comprises:
a nickel layer over and in physical contact with the PPI, wherein the PPI extends beyond edges of the nickel layer; and
a solder ball over and electrically coupled to the nickel layer, and wherein the solder ball comprises a top portion having a rounded profile, with the top portion being over a top surface of the molding compound.

18. The device of claim 16, wherein the metal bump comprises:
a copper post over and in physical contact with the PPI; and
a solder layer over and electrically coupled to the copper post, wherein the solder layer has a top portion being over a top surface of the molding compound.

19. The device of claim 15 further comprising a metal finish on a top surface and sidewalls of the PPI, wherein the metal bump comprises solder, and wherein the molding compound and the solder are in physical contact with the metal finish.

20. The method of claim 1, wherein an entirety of the third opening is misaligned from the first opening.

* * * * *